United States Patent [19]

Dible

[11] Patent Number: 5,573,595
[45] Date of Patent: Nov. 12, 1996

[54] METHODS AND APPARATUS FOR GENERATING PLASMA

[75] Inventor: Robert D. Dible, Fremont, Calif.

[73] Assignee: Lam Research Corporation, Fremont, Calif.

[21] Appl. No.: 536,574

[22] Filed: Sep. 29, 1995

[51] Int. Cl.$^6$ ................................................. C23C 16/00
[52] U.S. Cl. ............................ 118/723 MP; 118/723 E; 118/723 I; 156/643.1; 427/569
[58] Field of Search ................ 118/723 E, 723 ER, 118/723 MP, 723 I, 723 IR; 156/643.1, 345, 627.1; 216/68, 71; 204/298.34, 298.08, 298.06, 298.12; 427/569

[56] References Cited

U.S. PATENT DOCUMENTS

| | | | |
|---|---|---|---|
| 4,539,068 | 9/1985 | Takagi et al. | 156/614 |
| 5,116,482 | 5/1992 | Setoyama et al. | 204/298.08 |
| 5,147,493 | 9/1992 | Nishimura et al. | 156/345 |
| 5,228,939 | 7/1993 | Chu | 156/345 |
| 5,273,610 | 12/1993 | Thomas, III et al. | 156/345 |
| 5,316,645 | 5/1994 | Yamagami et al. | 204/298.06 |
| 5,332,880 | 7/1994 | Kubota et al. | 219/121.52 |
| 5,414,324 | 5/1994 | Roth et al. | 315/111.21 |
| 5,433,813 | 7/1995 | Kuwabara | 156/345 |
| 5,436,424 | 7/1995 | Nakayama et al. | 219/121.43 |

*Primary Examiner*—R. Bruce Breneman
*Assistant Examiner*—Joni Y. Chang
*Attorney, Agent, or Firm*—Hickman Beyer & Weaver

[57] ABSTRACT

A device for generating plasma for use in semiconductor fabrication, which includes a first radio frequency excitation source for outputting a first excitation current having a first phase and a first amplitude. The device further includes a second radio frequency excitation source for outputting a second excitation current having a second phase and a second amplitude and a plasma generating element having a first end and a second end for receiving respectively the first excitation current and the second excitation current. Moreover, the inventive device includes a control circuit having a control input for receiving a user-variable signal indicative of a desired phase difference between the first phase and the second phase. The control circuit, responsive to the control input, outputs a control signal to one of the first radio frequency excitation source and the second radio frequency excitation source for controlling respectively one of the first phase and the second phase, thereby causing an actual phase difference between the first phase and the second phase to substantially approximate the desired phase difference. In so doing, the device becomes essentially an inductive coupling device when the first phase and the second phase are opposite in phase. When the first phase and the second phase are in phase, the device becomes essentially a capacitive coupling device. Finally, when the first phase and the second phase differs by an angle that is between in phase and opposite in phase, the device becomes a combination inductive and capacitive coupling device.

23 Claims, 7 Drawing Sheets

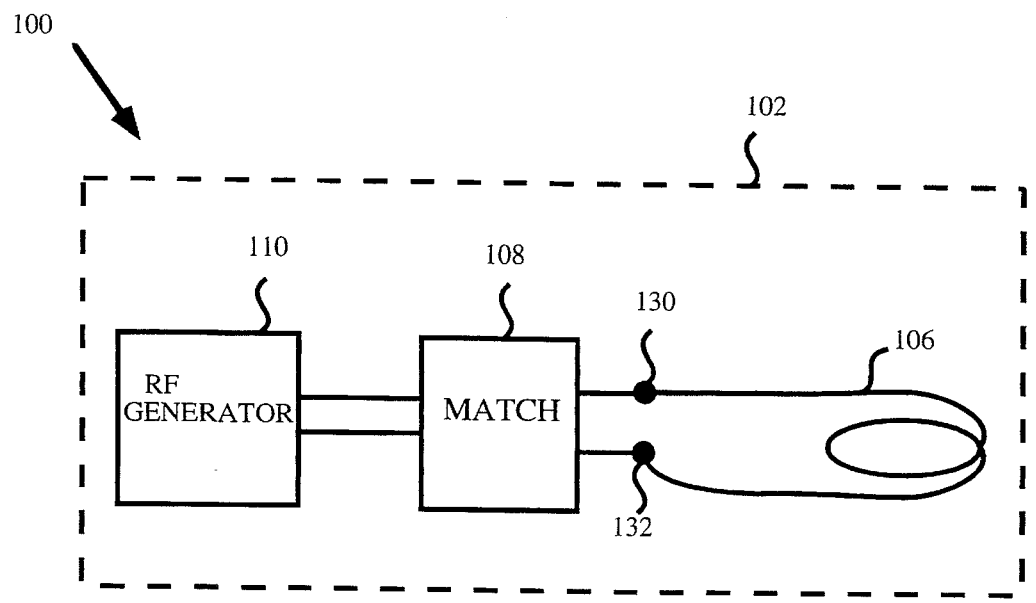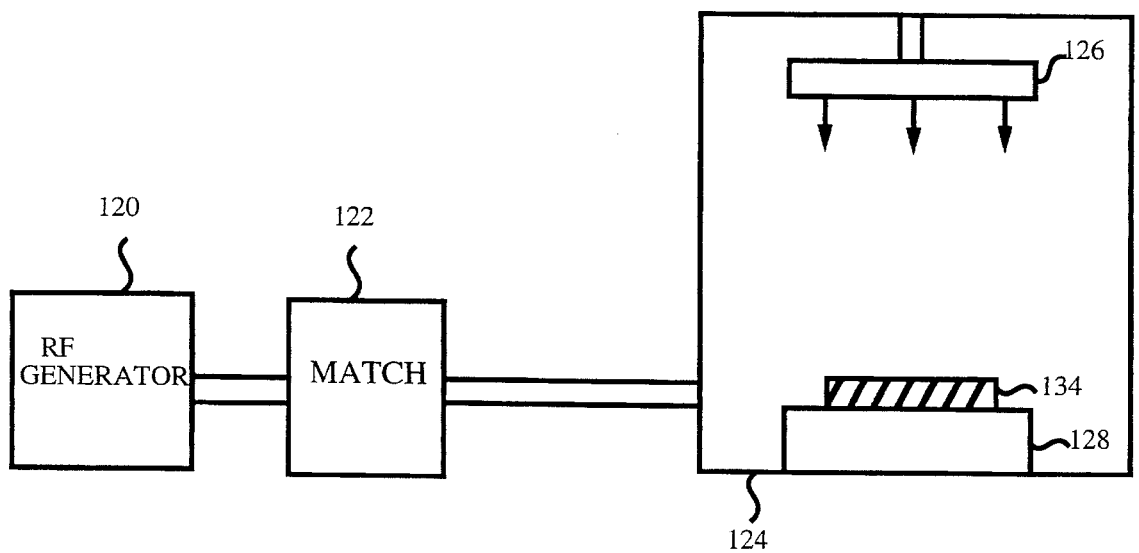
FIG. 1

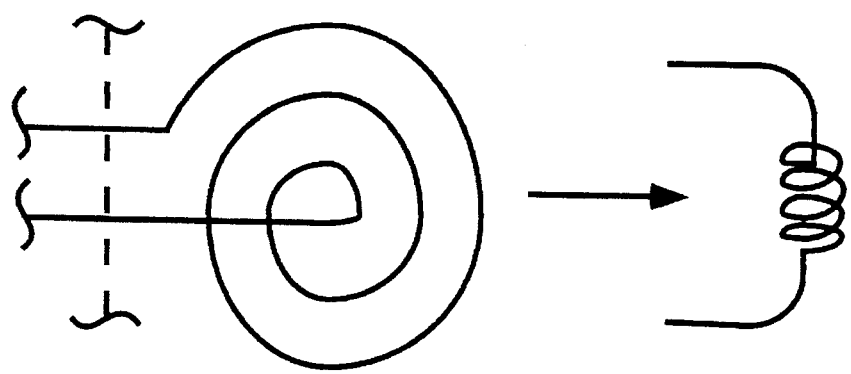
FIG. 5(a)  INDUCTIVE
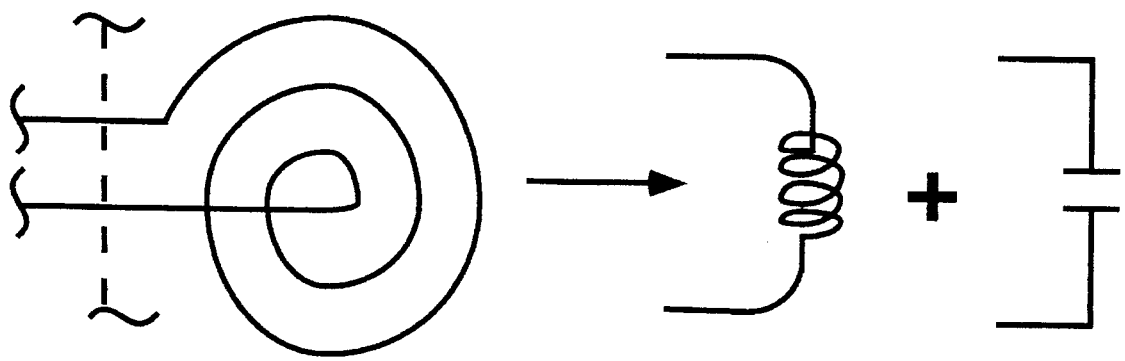
FIG. 5(b)  INDUCTIVE / CAPACITIVE
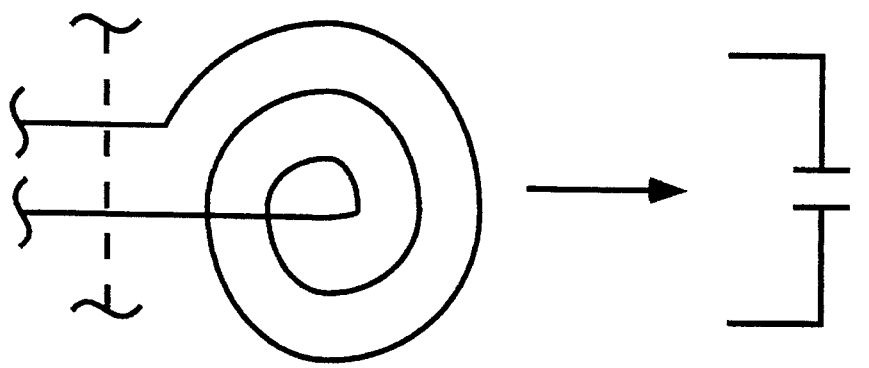
FIG. 5(c)  CAPACITIVE

METHODS AND APPARATUS FOR GENERATING PLASMA

BACKGROUND OF THE INVENTION

The present invention relates to methods and apparatus for inducing plasma in low pressure plasma systems, which are typically used in semiconductor fabrication. More specifically, the invention relates to methods and apparatus for variable control of the plasma generating element to achieve combinations of inductive and/or capacitive coupling.

Plasma-enhanced semiconductor processes for etching, oxidation, anodization, chemical vapor deposition (CVD), or the like are known.

For illustration purposes, FIG. 1 shows a chemical etch reactor 100, representing a plasma generating system which utilizes an inductive coil for plasma generation. Reactor 100 includes coil system 102 and chamber 124. Coil system 102 includes a coil element 106, which is biased by radio frequency generator 110 to act as an electrode. Coil element 106 is coupled to a matching circuit 108 for matching the impedance of coil element 106 to that of radio frequency generator 110. The matching of the impedances permits radio frequency generator 110 to efficiently deliver power to coil element 106. To provide a path to ground, the chamber wall of chamber 124 is typically grounded. Alternatively, the ground path may be provided through the lower electrode, e.g., a chuck 128 of FIG. 1, when the plasma is confined.

Within chamber 124, there typically exists a vacuum. A shower head 126 is disposed above a chuck 128 and wafer 134, which is supported by chuck 128. Chuck 128 acts as a second electrode and is preferably biased by its independent radio frequency circuit 120 via a matching network 122. It should be borne in mind that the components of FIG. 1, as well as of other figures herein, are shown only representatively for ease of illustration and to facilitate discussion. In actuality, coil element 106 and match 108 are typically disposed proximate to chamber 124 while RF generator 110 may be placed in any reasonable location.

Shower head 126 represents the apparatus for dispensing deposition materials onto wafer 134. Shower head 126 preferably includes a plurality of holes for releasing gaseous source materials (typically around the periphery edge of shower head 126) into the RF-induced plasma region between itself and wafer 134 during operation. In one embodiment, shower head 126 is made of quartz although it may also be made of other suitable materials and may be left either electrically floating or grounded.

In the prior art, there exists capacitively coupled plasma systems. It has been discovered, however, that inductively coupled plasma generates higher plasma density, which is more suitable for certain low pressure processes. In the prior art, the relative phases at first coil end 130 and second coil end 132 of coil system 102 is a function of the electrical length of the coil and the operating frequency and is consequently relatively fixed.

However, a plasma generating system that is preset to couple its plasma either inductively or capacitively is inherently limiting. Modern fabrication processes demand flexibility on the part of the equipment that are used to fabricate semiconductor circuits. Consequently, there has been efforts to provide for plasma generating systems that can be configured, in a flexible manner, as either an inductive system, a capacitive system, or one that provides for a combination of both inductive and capacitive coupling.

By way of example, there exists in the prior art a control circuit which utilizes four capacitors for producing either inductively coupled plasma or capacitively coupled plasma. This prior art control circuit, which is essentially analog in character, controls the coupling of the coil by varying the capacitance of one or more capacitors.

Although the aforementioned control scheme has some advantages, it nevertheless represents an electromechanical approach, which results in many attendant disadvantages. For example, it is difficult to set up the capacitors in the prior art analog control circuit because the setup parameters depend on the specific measurements pertaining to a particular reactor.

Further, the prior art electromechanical approach to providing the desired combination of inductive/capacitive coupling is static and is therefore difficult to change to accommodate, in a flexible and simple manner, applications that demand different combinations of inductive and/or capacitive coupling. Most significantly, it is difficult to vary, as a function of time, combinations of inductive and capacitive coupling using the prior art electromechanical approach.

In view of the foregoing, what is desired is new apparatus and methods for achieving, in a flexible and simple manner, variable combinations of inductive and/or capacitive coupling in a plasma generating system.

SUMMARY OF THE INVENTION

The invention relates, in one embodiment, to a device for generating plasma for use in semiconductor fabrication, which includes a first radio frequency excitation source for outputting a first excitation current having a first phase and a first amplitude. The inventive device further includes a second radio frequency excitation source for outputting a second excitation current having a second phase and a second amplitude and a plasma generating element having a first end and a second end for receiving respectively the first excitation current and the second excitation current.

Moreover, the inventive device includes a control circuit having a control input for receiving a user-variable signal indicative of a desired phase difference between the first phase and the second phase. The control circuit, responsive to the control input, outputs a control signal to one of the first radio frequency excitation source and the second radio frequency excitation source for controlling respectively one of the first phase and the second phase, thereby causing an actual phase difference between the first phase and the second phase to substantially approximate the desired phase difference. In so doing, the device becomes essentially an inductive coupling device when the first phase and the second phase are opposite in phase. When the first phase and the second phase are in phase, the device becomes essentially a capacitive coupling device. Finally, when the first phase and the second phase differs by an angle that is between in phase and opposite in phase, the device becomes a combination inductive and capacitive coupling device.

In another embodiment, the invention relates to a method for generating plasma for use in plasma-enhanced semiconductor processes, which includes the step of generating a first excitation current using a first radio frequency excitation source. The first excitation current has a first phase and a first amplitude. Further, the invention includes the step of generating a second excitation current using a second radio frequency excitation source, the second excitation current having a second phase and a second amplitude.

Moreover, the inventive method includes the step of providing the first excitation current and the second excitation current to a plasma generating element, the plasma generating element having a first end and a second end for receiving respectively the first excitation current and the second excitation current. Additionally, there is provided the step of controlling one of the first excitation current and second excitation current using a control circuit. The control circuit has a control input for receiving a signal indicative of a desired phase difference between the first phase and the second phase.

The control circuit, responsive to the control input, outputs a control signal to one of the first radio frequency excitation source and the second radio frequency excitation source for controlling respectively one of the first phase and the second phase, thereby causing an actual phase difference between the first phase and the second phase to substantially approximate the desired phase difference. In so doing, the method generates essentially inductively coupled plasma when the first phase and the second phase are opposite in phase. When the first phase and the second phase are in phase, the method generates essentially capacitively coupled plasma. Finally, when the first phase and the second phase differs by an angle that is between in phase and opposite in phase, the method generates essentially a combination of inductively coupled and capacitively coupled plasma.

These and other advantages of the present invention will become apparent upon reading the following detailed descriptions and studying the various figures of the drawings.

BRIEF DESCRIPTION OF THE DRAWINGS

FIG. 1 shows, for illustration purposes, a chemical etch reactor, representing a plasma generating system which utilizes an inductive coil for plasma generation;

FIGS. 5A–5C shows the excitation currents output by the RF excitation sources at various phase angles, along with the resulting couplings (in symbolic form);

DETAILED DESCRIPTION OF THE PREFERRED EMBODIMENTS

FIG. 1 shows, for illustration purposes, a chemical etch reactor 100, representing a plasma generating system which utilizes an inductive coil for plasma generation.

Figure 2:
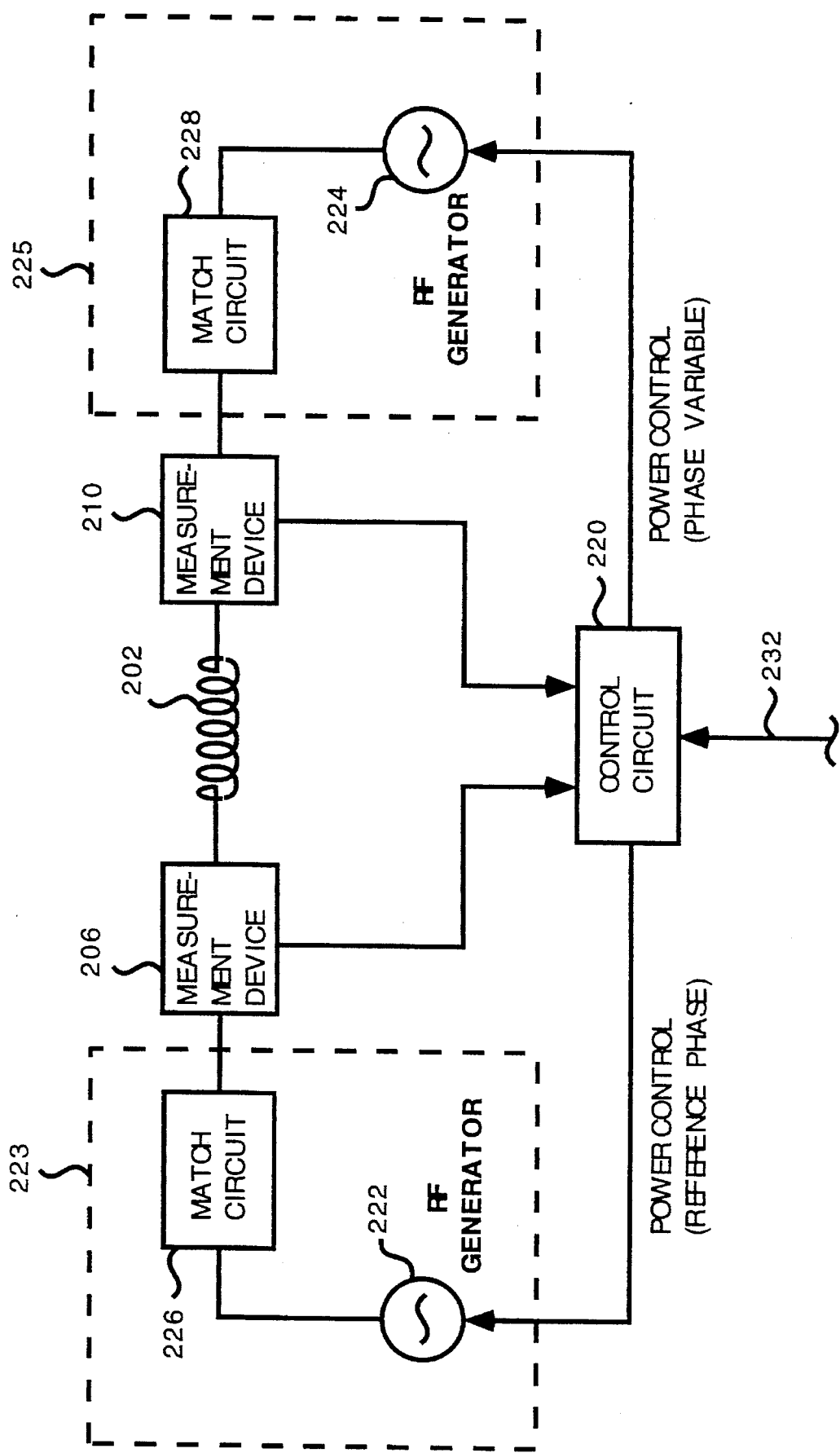
FIG. 2 is a diagram of the plasma generating system in accordance with one embodiment of the present invention.

FIG. 2 is a diagram of the plasma generating system in accordance with one embodiment of the present invention. Referring now to FIG. 2, there is shown a plasma generating system 200, which includes a plasma generating element 202. Plasma generating element 202 represents, in one embodiment, an inductive coil, e.g., one known as a TCP™ (transformer coupled plasma) coil, although the inventive plasma generating system of the present invention may be extended to include any type of inductive plasma generating element. The coil itself may have any number of configurations, including the Archimedes spiral configuration. Further, plasma generation element 202 is preferably planar although nonplanar plasma generation elements are also suitable.

At a first end 204 of plasma generating element 202, there is coupled a measurement device 206. Measurement device 206 preferably measures the voltage at first end 204. In one embodiment, however, measurement device 206 may be configured to measure other electrical parameters such as current, phase, vector impedance, and the like. Similarly, there is coupled at second end 208 of plasma generating element 202 a second measurement device 210. Like measurement device 206, measurement device 210 is preferably used to measure voltages although measurements of current, phase, vector impedance, as well as any other desired electrical perimeter at second end 208 may also be obtained if desired.

In one specific example, measurement devices 206 and 210 represent voltage probes to measure the voltages at the ends of plasma generating element 202. These voltage measurements are preferably representations of the currents being measured. (The term current is used herein to also denote the flow of electrical energy, which occurs at measurable voltage levels). Consequently, they preferably have the same waveform as those excitation currents existing at the ends of plasma generating element 202. The voltage measurements are utilized, in one embodiment, as feedback signals by a control circuit 220 to, for example, ascertain the phase difference between excitation currents at these two ends. Responsive to the ascertained phase difference, control circuit 220 may then provide control signals to one or both RF excitation sources 223 and 225 to modify the phase of the current output thereby to achieve the desired phase difference at the coil ends. In so doing, the desired combinations of inductive and/or capacitive coupling are obtained.

Unlike the electromechanical approach of the prior art, control circuit 220 preferably implements a electronic controller, e.g., solid state. By implementing control circuit 220 electronically, the inventive plasma generating system has multiple advantages over the prior art. For example, it is now possible to more finely derive the various combinations of inductive and/or capacitive coupling provided by the plasma generating element. Further, it is possible to make those combinations varying over time, or to pulse between combinations or coupling modes if desired. As discussed, these capabilities were lacking in the prior art electromechanical control solutions.

Excitation currents are provided to plasma generating element 202 via radio frequency (RF) excitation sources 223 and 225 respectively. In RF excitation source 223, there is provided a RF generator 222 for providing the sourcing current, which then traverses matching circuit 226 prior to being input into one end of plasma generating element 202 as one of the excitation currents. Similarly, RF excitation source 225 includes a RF generator 224, representing the source for another excitation current. The current output by RF generator 224 traverses matching circuit 228 to provide another excitation current to the other end of plasma generating element 202.

RF generators 222 and 224 may represent any number of commercially available radio frequency generators, preferably one having a phase input such as an AE model RFG 1250, which is available from Advanced Energy Industries, Inc. of Fort Collins, Colo. As will be explained in detail later, the inventive plasma generating system utilizes the RF generator phase input to flexibly achieve combinations of capacitive and/or inductive coupling for its plasma.

Note that unlike the prior art plasma generating systems, which uses only one generator and one matching network for generating a fixed capacitive/inductive coupling combination, the present invention utilizes two radio frequency generators and two matching networks for the two ends of the plasma generating element. Because of this, flexibility in the control of the relative phases at those two ends is substantially enhanced. Since the energy to the plasma generating element itself is controlled so that different phases can be presented at the two ends of the plasma generating element, there is practically no limit to the type of waveforms that can be generated, even during a process run if desired, across the plasma generating element. Advantageously, the ability to derive various combinations capacitive/inductive coupling for the plasma is substantially enhanced, with concomitant control over the plasma that results therefrom.

As mentioned earlier, the function of a matching circuit is essentially to match the output impedance of the RF generator to the input impedance of the plasma generating element. As an example, plasma generating element 202 may have an input impedance of, say, about 2–3 Ω. However, modern generators typically operate at about 50 Ω. By matching up these impedances, a matching circuit enables the RF generator, e.g., RF generator 222 or 224, to deliver power to its plasma generating element in an efficient manner.

In one embodiment, matching circuits 226 and 228 are implemented by transformer networks. In another embodiment, matching circuits 226 and 228 represent fixed nontunable matching networks with the generators providing the necessary current and voltage headroom required for any plasma condition. However, it is contemplated that continuously tunable or switch tuning elements may be employed in matching circuits 226 and 228, if appropriate, without departing from the scope and spirit of the present invention.

Control circuit 220 further includes a phase input terminal 232, representing a control input whereby signals indicative of the desired phase differences may be input. In one embodiment, the desired amplitude is also input into control circuit 220 for generating amplitude control signals to RF generator 222 and RF generator 224. When the amplitude is changed, the center to edge distribution of power in the coil correspondingly changes. Advantageously, the ability to dynamically control the center-to-edge distribution of power in the coil provides greater control over the plasma process since plasma parameters, such as density or the like, may be flexibly and accurately controlled at run time.

In operation, the electrical measurements obtained through measurement devices 206 and 210 are used by control circuit 220 to ascertain the difference in phases at first end 204 and second end 208. Control circuit 220, responsive to the ascertained phase difference at the ends of the plasma generating element and the desired phase difference at phase input terminal 232, then outputs a control signal to one or both of RF generators 222 and 224. This control signal is input into the phase input of the RF generator to modify the phase of the RF generator output.

In one embodiment, RF generator 222 provides a fixed phase reference through matching network 226 and via the frequency at which plasma generating system 200 operates. The other RF generator in the plasma generating system 200, e.g., RF generator 224, also operates at the same frequency. However, the phase and amplitude of RF generator 224 may be varied through its phase input. In this embodiment, the control signal from control circuit 220 needs to be input into only one of the RF generators, e.g., RF generator 224, to modify the phase difference at the two ends of plasma generating element 202.

In other embodiments, however, it is contemplated that both RF generators 222 and 224 may be configured to have, responsive to their phase inputs, variable output phases and amplitudes. In this case, control circuit 220 preferably generates a plurality of control signals to individually control the multiple RF generators in plasma generating system 200.

If RF generators 222 and RF generators 224 are controlled such that both first end 204 and second end 208 are in phase, i.e., at the same phase, there is no current through plasma generating element 202 and the coupling is purely capacitive. On the other hand, if RF generator 222 and RF generator 224 are controlled such that their respective phases are opposite in phase, i.e., have a 180° offset, the coupling becomes purely inductive with almost no capacitive coupling. In between the in phase and opposite in phase situations, a combination of inductive/capacitive coupling may be obtained. The exact combination depends on the input signal representing the desired phase difference, which exists at phase input terminal 232 in one embodiment.

Figure 3:
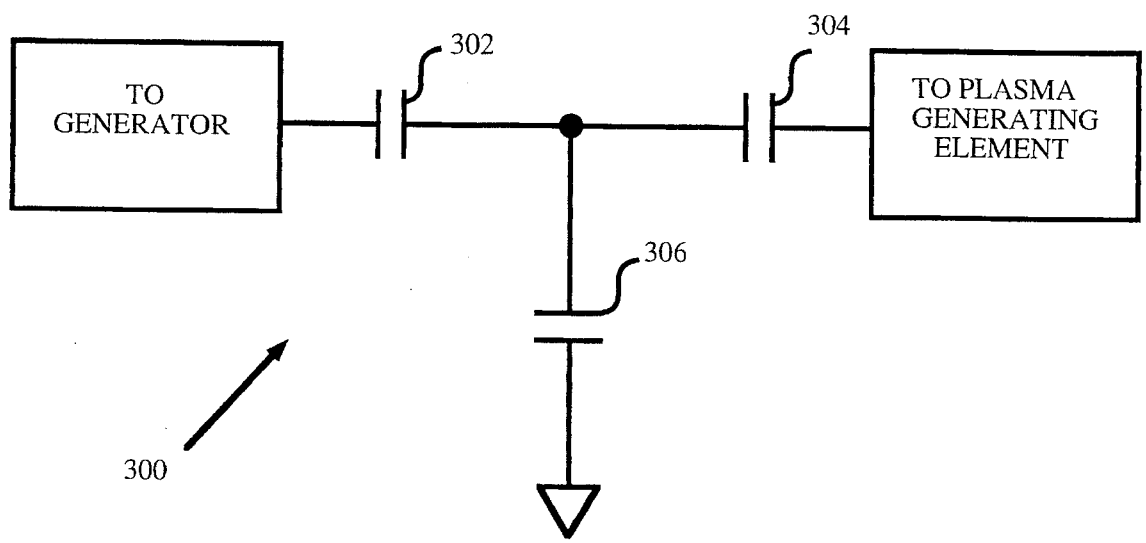
FIG. 3 shows an example of one embodiment of a matching circuit, which utilizes three variable capacitors in a T configuration.

FIG. 3 shows an example of one embodiment of a matching circuit 300, which utilizes three variable capacitors 302, 304, and 306 in a T configuration. Matching circuit 300 may be used to implement, for example, matching circuit 226 or matching circuit 228 of the plasma generating system 200 of FIG. 2. As shown in FIG. 3, one end of the T-configured capacitor network is coupled to the RF generator while another end is coupled to the plasma generating element. In between these two capacitors, a third capacitor is coupled to ground. The variable capacitors 302, 304, and 306 may be individually adjusted to achieve the right match between the output impedance of the RF generator and the input impedance of the plasma generating element. It should be kept in mind that FIG. 3A is only illustrative and other matching network designs, which are known in the art, may also be employed in the present inventive plasma generating system.

Figure 4:
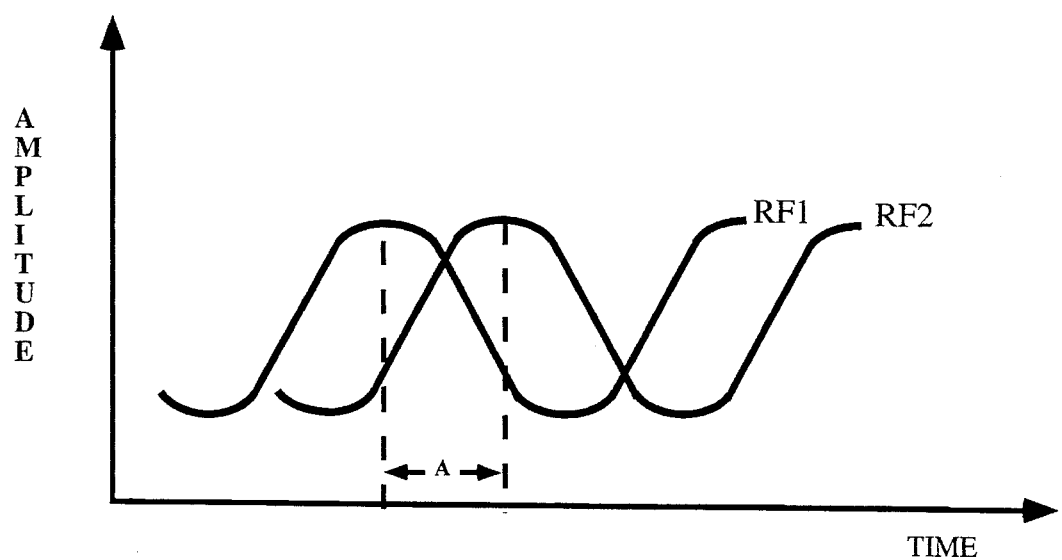
FIG. 4 is a graph illustrating two signals, RF1 and RF2, including their phases.

To further illustrate, FIG. 4 is a graph illustrating two signals, RF1 and RF2, including their phases. Signal RF1 represents, for example, the phase of the excitation current supplied to one end of plasma generating element 202 while signal RF2 may represent the phase of the excitation current supplied to the other end of that plasma generating element. As is shown in FIG. 4, signals RF1 and RF2 have substantially the same frequency but differ in phases by an angle A. As mentioned earlier, it is this difference in phases that determines whether the coupling provided by plasma generating element 202 is purely inductive, purely capacitive, or a combination of both.

It should be kept in mind that although the amplitudes of signals RF1 and RF2 are shown to be substantially the same for ease of illustration, such is not required. In fact, it is contemplated that user control over the amplitudes of the signals output by the RF generators represents one important aspect of the present invention. In one embodiment, the desired amplitude of the RF generator output signal may be input into control circuit 220 for use in generating an amplitude control signal. This amplitude control signal may in turn be used to cause one or both RF generators to output signals having the desired amplitudes.

The excitation currents output by the RF excitation sources, e.g., excitation sources 223 and 225 of FIG. 2, at various phases are shown in FIGS. 5A–5C. Correspondingly, the resulting couplings caused by the output phases are also shown (in symbolic form). In FIG. 5A, the excitation currents into the ends of the plasma generating element are opposite in phase, i.e., are 180° out of phase. Therefore, the coupling is purely inductive as shown symbolically in FIG. 5A.

In FIG. 5B, the excitation currents have their phases offset by an angle that is between 0° and 180°. Consequently, the resulting coupling is both inductive and capacitive, as shown symbolically in FIG. 5B. In FIG. 5C, the excitation currents are in phase, i.e., offset by 0°. Therefore, the coupling is purely capacitive, as shown symbolically in FIG. 5C.

Figure 6:
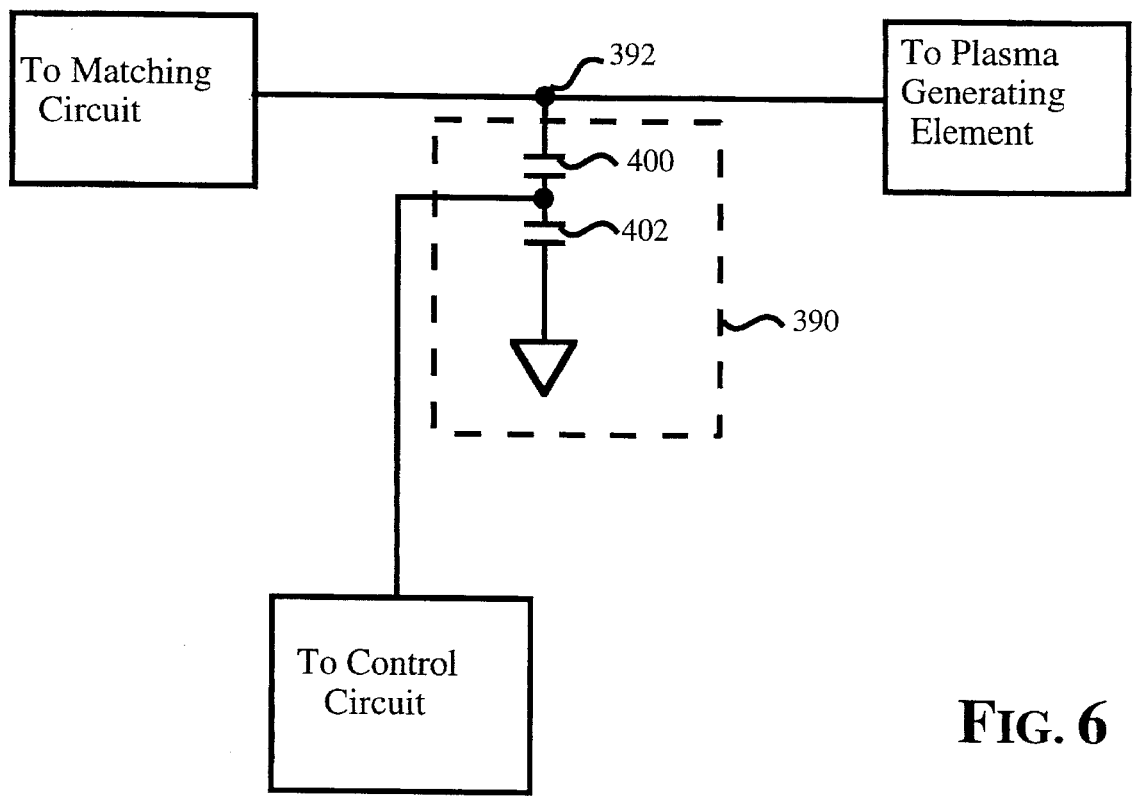
FIG. 6 shows one embodiment of a voltage probe for measuring the potential level at one end of the plasma generating element.

FIG. 6 shows one embodiment of a voltage probe 390 for measuring the potential level at a plasma generating element end. Voltage probe 390 may represent, for example, measurement device 206 or measurement device 210 of FIG. 2. Referring now to FIG. 6, voltage probe 390 includes two capacitors 400 and 402 in series between ground and point 392. Point 392 represents the point which has the potential to be measured, e.g., the end of the plasma generating element. As is apparent, capacitors 400 and 402 act as a capacitor divider network for outputting a measurement signal, which preferably has the same waveform as that of the signal being measured.

In one embodiment, capacitors 400 and 402 are preferably selected to be small capacitors, say, 10 pf for capacitor 400 and about 990 pf for capacitor 402. These capacitors are preferably small to avoid unduly affecting the electrical characteristics of the signal being measured. In this example, the measurement signal on conductor 402 has the same waveform as that at node 392, albeit having only 1% of the amplitude of the latter. It should be kept in mind that FIG. 5 represents only one scheme for measuring the voltage on a conductor and there are other known schemes that may also be suitable for the purposes described herein.

Figure 7:
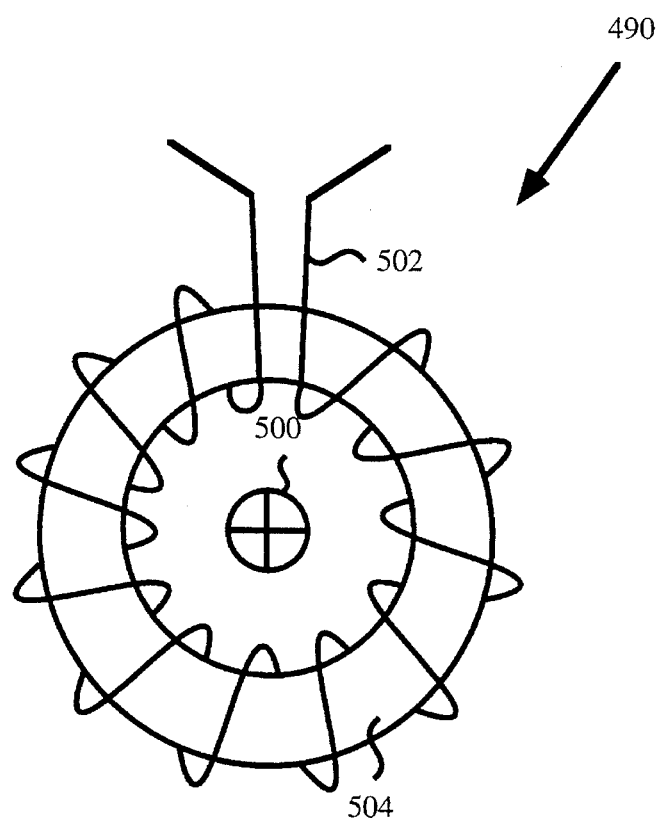
FIG. 7 shows in one embodiment a current probe for measuring current through a conductor.

FIG. 7 shows in one embodiment a current probe 490 for measuring current through a conductor. Current probe 490 may be used to, for example, implement measurement device 206 or measurement device 210. For best accuracy, a measurement device, such as current probe 490, is preferably placed close to the end of the coils although this is not an absolute requirement. Referring now to FIG. 7, there is shown a conductor 500 for carrying a current to be measured. The current to be measured may represent, for example, the excitation current provided to one end of the plasma generating element. Surrounding conductor 500 is a toroid 504, which is preferably made of ferrite. On toroid 504, a conductor 502 is wound for a specified number of windings. For ease of illustration, 50 windings are arbitrarily chosen. The current in conductor 502 is then the ratio of the current through conductor 500 divided by the number of turns, or windings, that conductor 502 makes on toroid 504, or 1/50 of the current through conductor 500. This current in conductor 502 further has substantially the same waveform as that of the current in conductor 500.

The current in conductor 502 may be used for control purposes by, for example, control circuit 220 of FIG. 2, to generate the appropriate amplitude and phase control signals for output to one or both of the RF generators. It should be borne in mind that the current probe of FIG. 7 is meant to be illustrative and there exists other known schemes for taking a measurement of the current of a signal which may also be suitable.

Figure 8:
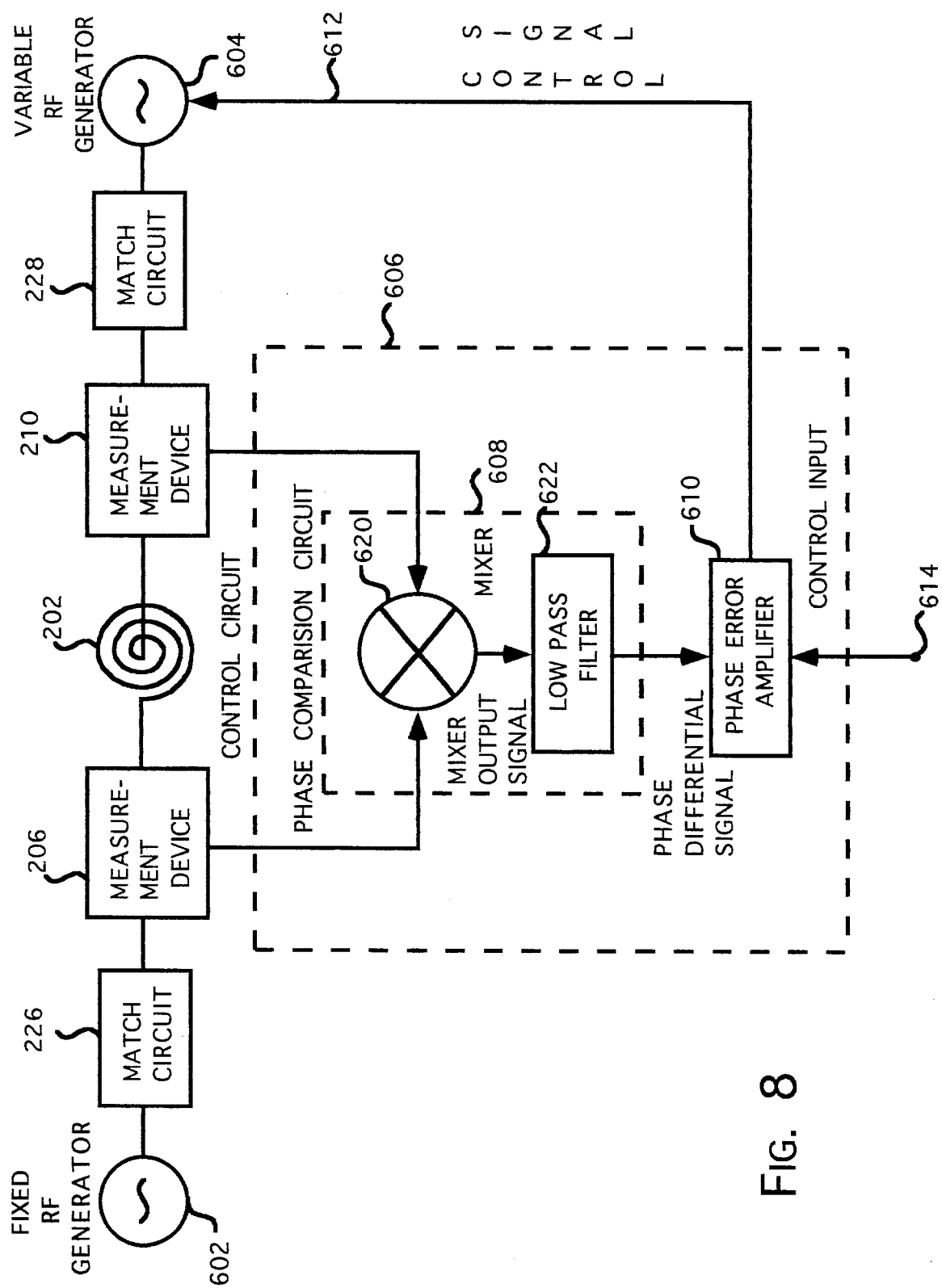
FIG. 8 shows yet another embodiment of the inventive plasma generating system.

FIG. 8 shows yet another embodiment of the inventive plasma generating system 200. In FIG. 8, control circuit 606 is implemented by a phase comparison circuit 608 and a phase error amplifier 610. Plasma generating element 202, measurement devices 206 and 210, and match circuits 226 and 228 are substantially similar to those of FIG. 2. Radio frequency (RF) generator 602, however, is implemented as a fixed phase generator in the example of FIG. 8 while RF generator 604 is implemented as a variable phase generator. As such, variable phase RF generator 604 is capable of receiving a phase input signal on conductor 612 and produces a current whose phase reflects the phase value indicated by the phase input signal on conductor 612.

Figure 9:
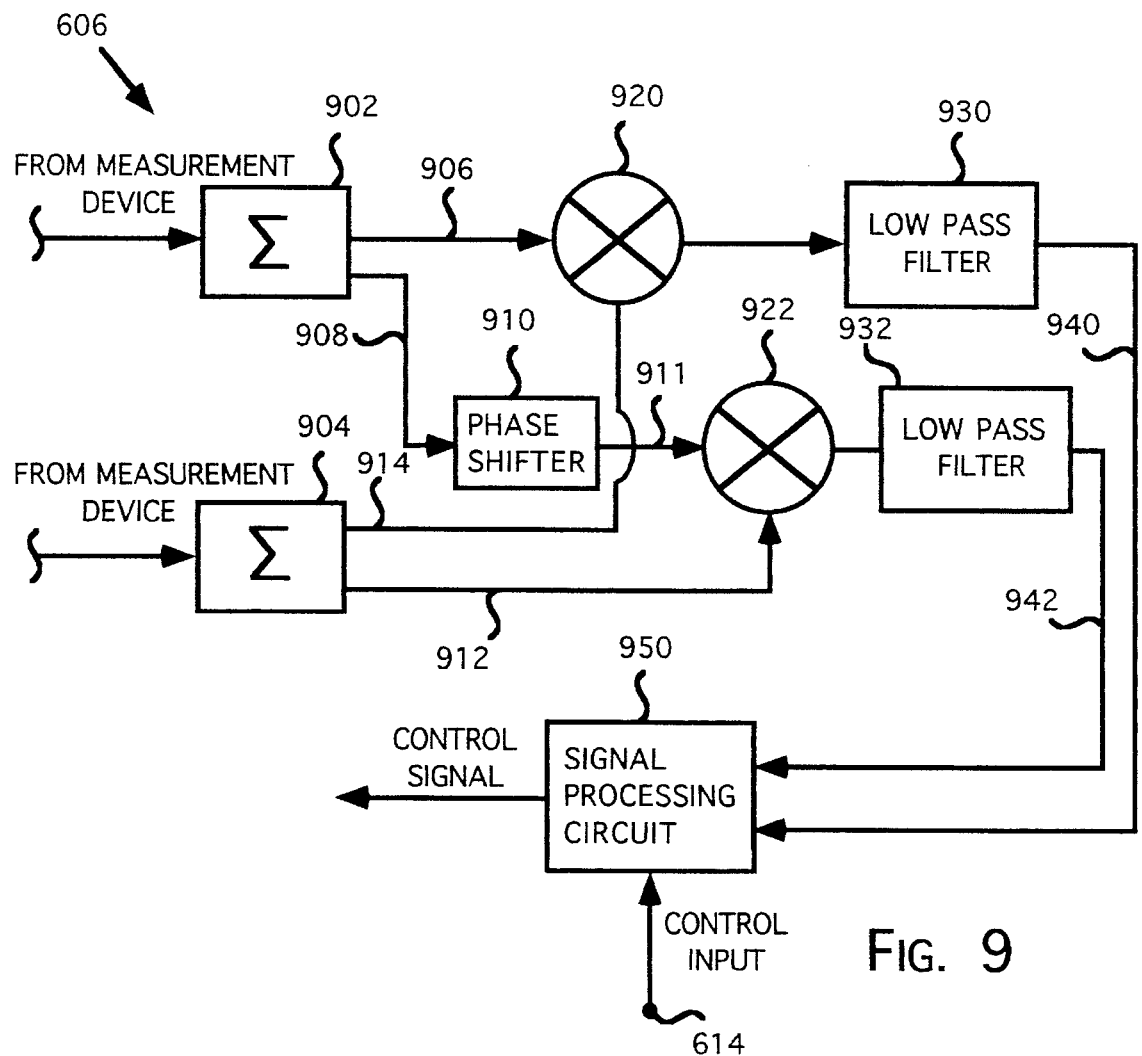
FIG. 9 illustrates a phase detection scheme utilizing quadrature detection.

Phase comparison circuit 608 represents any number of known circuits for comparing the phases of two signals. By way of example, FIG. 9 illustrates a phase detection scheme utilizing quadrature detection. In the specific example of FIG. 8, however, phase comparison circuit includes a mixer circuit 620 and a low pass filter circuit 622. Mixer circuit 620 may be implemented by any known mixer circuit techniques. Mixer circuit 620 receives the measurement signals from measurement devices 206 and 210 and compares the phases of the measurement signals to output a mixer output signal, which represents the phase angle. In the specific example of FIG. 8, measurement devices 206 and 210 represent voltage probes for measuring the voltages at the ends of plasma generating element 202. As mentioned earlier, however, measurement devices 206 and 210 may be configured to measure other electrical parameters (such as current among others) as well.

The mixer output signal is then input into low pass filter circuit 622. Like mixer circuit 620, low pass filter circuit 622 may also be implemented using known low pass filtering technique. Low pass filter circuit 622 then outputs a phase differential signal, which is then input into phase error amplifier circuit 610.

The desired phase difference between the currents produced by RF generators 602 and 604 are input at terminal 614. Responsive to this desired phase difference signal and the phase differential signal output from low pass filter circuit 622 of phase comparison circuit 608, phase error amplifier circuit 610 then outputs a control signal on conductor 612, which is then input as a phase input signal into variable phase RF generator 604. Phase error amplifier circuit 610, which may be implemented by a variety of known control and amplification circuits, represents a circuit that produces a control signal for causing variable phase RF generator 604 to generate an output current whose phase differs from the phase of the current output by RF generator 602 by an amount that equals the desired phase difference value (input at terminal 614).

In this manner, the phase of the output current of RF generator 602 is fixed while the phase of the output current of variable phase generator 604 is modified so as to produce a phase difference that substantially approximates the desired phase difference value. As the desired phase difference value input signal at terminal 614 is changed, the actual phase difference between the phases of the currents output by RF generators 602 and 604 correspondingly changes to produce various combinations of inductive and capacitive coupling for plasma excitation.

FIG. 9 shows another control circuit which utilizes quadrature detection for ascertaining the difference in phase between two measurement signals. Referring now to FIG. 9, two measurement signals, e.g., measurement devices 206 and 210 of FIG. 2, are input into summing circuits 902 and 904. Each of summing circuit 902 and 904 is configured to split its incoming signals into two signals to facilitate quadrature comparison. With reference to summing circuit 902, for example, two substantially identical signals 906 and 908 are produced. As expected, the amplitude each of signals 906 and 908 is approximately 3 dB lower (ignoring loss in the summing circuit which, in one embodiment, is about 0.5 dB) than the measurement signal that is input into summing circuit 902. This is because the power of each output signal of the summing circuit is about half of its input signal power. Signal 908 is then input into a phase shifter circuit 910, which in one embodiment delays the phase of signal 908 by about 90 degrees. Phase shifter circuit 910 outputs a phase shifted signal 911 as shown.

Summing circuit 904 outputs two signals 912 and 914, which are substantially identical to one another. Signal 914 is processed, along with signal 906 from summing circuit 902, by a mixer circuit 920. Signal 912 is processed, along with phase shifted signal 911, by a mixer circuit 922. Each of mixer circuits 920 and 922 functions to detect the phase difference between its input signals and outputs a mixer output signal. The mixer output signals from mixer circuits 920 and 922 are then filtered via low pass filters 930 and 932, respectively, to derive the DC component of the mixer output signals.

The signals output by low pass filters 930 and 932 are then processed via a signal processing circuit 950 to derive the control signal for controlling the variable RF generator, e.g., variable RF generator 224 of FIG. 2. In one embodiment, signal processing circuit includes, among others, a phase error detector circuit. The control input into signal processing circuit 950 is substantially identical to the control input described in FIG. 8 and is used to indicate the desired phase difference.

Figure 10:
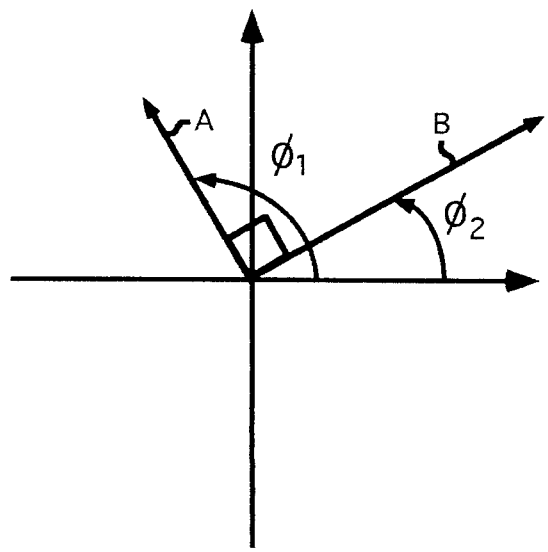
FIG. 10 illustrates a rotating phasor diagram in which two vectors are shown for discussing the advantages associated with quadrature detection.

The control circuit of FIG. 9 advantageously facilitates improved phase differentiation since the difference in the input amplitudes of the two measurement signals are substantially normalized. To illustrate, FIG. 10 shows a rotating phasor diagram in which two vectors A and B are shown. Vector A represents the phase of the signal that low pass filter 930 outputs. Vector B, on the other hand, represents the phase of the signal that low pass filter 932 outputs. At any given point in time, vector A is Ø1 degrees away from the reference phase, which reference phase may be generated by, for example, the fixed phase RF generator. Vector B lags (or leads) vector A by 90 degrees and is Ø2 degrees away from the reference phase. Since Ø1 and Ø2 are related to one another according to the following equation:

$$\cos^2 Ø1 + \sin^2 Ø2 = 1$$

the actual phase relationship between the two phases at any given point in time may be more accurately determined irrespective of the difference in their input amplitudes and their absolute positions on the phasor diagram of FIG. 10.

It should be borne in mind that although the components of FIGS. 8 and 9 are described in terms of circuits and signals, such components may actually represent digital circuitry operating on digital data in a specific implementation. The use of A/D converters to facilitate signal processing by digital circuitry is known and may well be employed to implement all or part of the circuits of FIGS. 8 and 9.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A device for generating plasma for use in semiconductor fabrication, comprising:

a first radio frequency excitation source for outputting a first excitation current having a first phase and a first amplitude;

a second radio frequency excitation source for outputting a second excitation current having a second phase and a second amplitude;

a plasma generating element having a first end and a second end for receiving respectively said first excitation current and said second excitation current; and a control circuit having a control input, said control input receiving a user-variable signal indicative of a desired phase difference between said first phase and said second phase, said control circuit, responsive to said control input, outputs a control signal to one of said first radio frequency excitation source and said second radio frequency excitation source for controlling respectively one of said first phase and said second phase, thereby causing an actual phase difference between said first phase and said second phase to substantially approximate said desired phase difference, whereby said device becomes essentially an inductive coupling device when said first phase and said second phase are opposite in phase, said device becomes essentially a capacitive coupling device when said first phase and said second phase are in phase, said device becomes a combination inductive and capacitive coupling device when said first phase and said second phase differs by an angle that is between in phase and opposite in phase.

2. The device of claim 1 wherein each of said first radio frequency excitation source and said second radio frequency excitation source includes:

a radio frequency generator; and a matching circuit coupled to said radio-frequency generator for matching an output impedance of said radio frequency generator with an input impedance of said plasma generating element to optimize power delivery by said radio frequency generator.

3. The device of claim 2, further comprising:

a first measurement device coupled to said first end and said control circuit, said first measurement device outputting to said control circuit a first measurement signal indicative of said first phase; and a second measurement device coupled to said second end and said control circuit, said second measurement device outputting to said control circuit a second measurement signal indicative of said second phase, whereby said first measurement signal and said second measurement signal are utilized by said control circuit in deriving said control signal.

4. The device of claim 3 wherein said first phase is fixed and said second phase is variable responsive to said control signal.

5. The device of claim 3 wherein said plasma generating element is a planar coil.

6. The device of claim 3 wherein said plasma generating element is a nonplanar coil.

7. The device of claim 3 wherein said first measurement device is a voltage probe.

8. The device of claim 3 wherein said first measurement device is a current probe.

9. The device of claim 3 wherein said control circuit comprises:

a phase comparison circuit coupled to said first measurement device and said second measurement device for generating a phase differential signal; and a phase error amplifier coupled to said phase comparison circuit, said control input and one of said first radio frequency excitation source and said second radio frequency excitation source, said phase error amplifier generating said control signal responsive to said phase differential signal and said control input.

10. The device of claim 9 wherein said phase comparison circuit comprises:

a mixer circuit coupled to said first measurement signal and said second measurement signal for generating a mixer output signal; and a low pass filter coupled to said mixer circuit for generating, responsive to said mixer output signal said phase differential signal.

11. The device of claim 9 wherein said phase comparison circuit employs quadrature detection.

12. A method for generating plasma for use in plasma-enhanced semiconductor processes, comprising:

generating a first excitation current using a first radio frequency excitation source, said first excitation current having a first phase and a first amplitude;

generating a second excitation current using a second radio frequency excitation source, said second excitation current having a second phase and a second amplitude;

providing said first excitation current and said second excitation current to a plasma generating element, said plasma generating element having a first end and a second end for receiving respectively said first excitation current and said second excitation current; and controlling one of said first excitation current and second excitation current using a control circuit, said control circuit having a control input for receiving a signal indicative of a desired phase difference between said first phase and said second phase, said control circuit, responsive to said control input, outputs a control signal to one of said first radio frequency excitation source and said second radio frequency excitation source for controlling respectively one of said first phase and said second phase, thereby causing an actual phase difference between said first phase and said second phase to substantially approximate said desired phase difference, whereby said method generating essentially inductively coupled plasma when said first phase and said second phase are opposite in phase, said method generating essentially capacitively coupled plasma when said first phase and said second phase are in phase, said method generating essentially a combination of inductively coupled and capacitively coupled plasma when said first phase and said second phase differs by an angle that is between in phase and opposite in phase.

13. The method of claim 12 wherein said first radio frequency excitation source comprises a first radio frequency generator and said second radio frequency excitation source comprises a second radio frequency generator.

14. The method of claim 13 wherein said first radio frequency excitation source further comprises a first matching circuit coupled to said first radio frequency generator for matching an output impedance of said first radio frequency generator with an input impedance of said plasma generating element to optimize power delivery by said first radio frequency generator, said second radio frequency excitation source further comprises a second matching circuit coupled to said second radio frequency generator for matching an output impedance of said second radio frequency generator with an input impedance of said plasma generating element at said first end to optimize power delivery by said second radio frequency generator.

15. The method of claim 13, further comprising:

measuring an electrical parameter of said first excitation current, said electrical parameter being a parameter from which said first phase can be derived; and providing said electrical parameter to said control circuit as a first measurement signal, whereby said first measurement signal is used, in combination with said control input, by said control circuit in deriving said control signal.

16. The method of claim 15 wherein said measuring step is performed using a voltage probe and said electrical parameter represents voltage.

17. The method of claim 13 wherein said first radio frequency generator is a fixed phase radio frequency generator and said second radio frequency generator is a variable phase radio frequency generator.

18. The method of claim 13 wherein said plasma generating element is a planar coil.

19. The method of claim 13 wherein said plasma generating element is a nonplanar coil.

20. An apparatus for generating plasma for use in plasma-enhanced semiconductor processes, comprising:

first means for generating a first radio frequency excitation current, said first radio frequency excitation current having a first phase and a first amplitude;

second means for generating a second radio frequency excitation current, said second radio frequency excitation current having a second phase and a second amplitude;

means for generating said plasma, utilizing energy supplied by said first radio frequency excitation current and said second radio frequency excitation current; and means for controlling one of said first radio frequency excitation current and second radio frequency excitation current, said control means having a control input for receiving a signal indicative of a desired phase difference between said first phase and said second phase, said control means, responsive to said control input, outputs a control signal to one of said first means for generating said first radio frequency excitation current and said second means for generating said second radio frequency excitation current for controlling respectively one of said first phase and said second phase, thereby causing an actual phase difference between said first phase and said second phase to substantially approximate said desired phase difference, whereby said apparatus generating essentially inductively coupled plasma when said first phase and said second phase are opposite in phase, said apparatus generating essentially capacitively coupled plasma when said first phase and said second phase are in phase, said apparatus generating essentially a combination of inductively coupled and capacitively coupled plasma when said first phase and said second phase differs by an angle that is between in phase and opposite in phase.

21. The apparatus of claim 20 wherein said first means for generating said first radio frequency excitation current comprises a first radio frequency generator and said second means for generating said second radio frequency excitation current comprises a second radio frequency generator.

22. The apparatus of claim 21 wherein said first radio frequency excitation source further comprises a first matching circuit coupled to said first radio frequency generator for matching an output impedance of said first radio frequency generator with an input impedance of said plasma generating element to optimize power delivery by said first radio frequency generator, said second radio frequency excitation source further comprises a second matching circuit coupled to said second radio frequency generator for matching an output impedance of said second radio frequency generator with an input impedance of said plasma generating element at said first end to optimize power delivery by said second radio frequency generator.

23. The apparatus of claim 22, further comprising:

means for measuring an electrical parameter of said first excitation current, said electrical parameter being a parameter from which said first phase can be derived, whereby said first measurement signal is used, in combination with said control input, by said control circuit in deriving said control signal.

* * * * *